United States Patent [19]
Nishizawa et al.

[11] Patent Number: 5,654,560
[45] Date of Patent: Aug. 5, 1997

[54] SEMICONDUCTOR DEVICE WITH CURRENT DETECTING FUNCTION AND METHOD OF PRODUCING THE SAME

[75] Inventors: Toshiaki Nishizawa, Obu; Akira Kuroyanagi, Okazaki; Tsuyoshi Yamamoto, Chiryu; Norihito Tokura, Okazaki, all of Japan

[73] Assignee: Nippondenso Co., Ltd., Kariya, Japan

[21] Appl. No.: 475,096

[22] Filed: Jun. 7, 1995

Related U.S. Application Data

[62] Division of Ser. No. 38,958, Mar. 29, 1993, Pat. No. 5,453,390.

[30] Foreign Application Priority Data

Mar. 30, 1992 [JP] Japan .................. 4-73697
Mar. 29, 1993 [JP] Japan .................. 5-89815

[51] Int. Cl.$^6$ ............................... H01L 29/74
[52] U.S. Cl. .............. 257/139; 257/329; 257/335; 257/337; 257/355; 257/360
[58] Field of Search ................. 257/329, 335, 257/337, 339, 341, 342, 345, 401, 355, 360, 139

[56] References Cited

U.S. PATENT DOCUMENTS

| | | |
|---|---|---|
| 4,553,084 | 11/1985 | Wrathall . |
| 4,783,690 | 11/1988 | Walden et al. ............... 257/355 |
| 4,896,199 | 1/1990 | Tsuzuki et al. ............... 257/355 |
| 4,962,411 | 10/1990 | Tokura et al. ............... 257/355 |
| 5,097,302 | 3/1992 | Fujihira et al. ............... 257/355 |
| 5,191,395 | 3/1993 | Nishimura ................... 257/328 |
| 5,288,653 | 2/1994 | Enjoh ........................... 437/41 |
| 5,365,085 | 11/1994 | Tokura ........................ 257/139 |
| 5,432,371 | 7/1995 | Denner et al. ............... 257/355 |

FOREIGN PATENT DOCUMENTS

| | | |
|---|---|---|
| 3720156 | 12/1987 | Germany . |
| 63-012175 A | 1/1988 | Japan . |
| 1265570 | 10/1989 | Japan . |
| 2285679 | 11/1990 | Japan . |
| 3270274 | 12/1991 | Japan . |
| 4355968 A | 12/1992 | Japan . |
| 4355968 | 12/1992 | Japan . |

OTHER PUBLICATIONS

Experimental Study of a High Blocking Voltage Power with Integrated Input Amplifier, L. Leipold et al, IEEE, 1983, pp. 428–431.

Primary Examiner—Minh-loan Tran
Attorney, Agent, or Firm—Cushman, Darby & Cushman IP Group of Pillsbury Madison & Sutro LLP

[57] ABSTRACT

A power semiconductor device having a current detecting function comprising a detection part that includes the elements of a better reach-through withstand voltage capability than those of a principal current part. The power semiconductor device comprises such elements as DMOS, IGBT or BPT cells. One area of the device acts as the detection part and another as the principal current part. The detection part and the principal current part share as their common electrode a high density substrate having a low density layer of a first conductivity type. The surface of the low density layer carries a principal and a subordinate well region of a second conductivity type each. The surface of the principal well region bears a surface electrode region of the first conductivity type acting as the other electrode of the principal current part; the surface of the subordinate well region carries a surface electrode region of the first conductivity type acting as the other electrode of the detection part. The subordinate well region is made shallower than the principal well region illustratively by use of a mask having narrower apertures through which to form the former region. This causes a reach-through to occur in the principal current part with its well region having a shorter distance to the high density substrate, and not in the detection part with its well region having a longer distance to the substrate.

21 Claims, 9 Drawing Sheets

FIG. 12
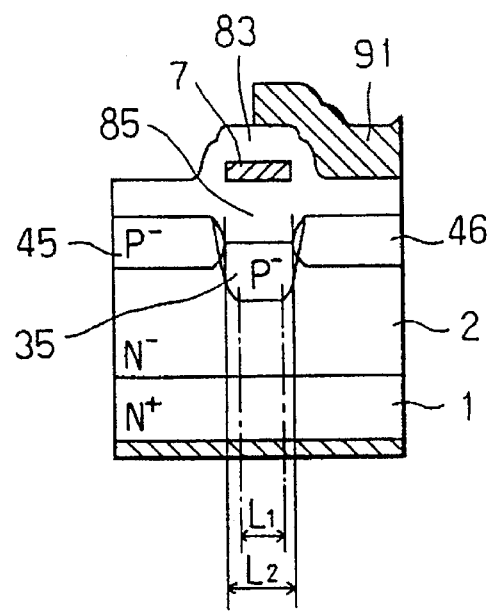
FIG. 13
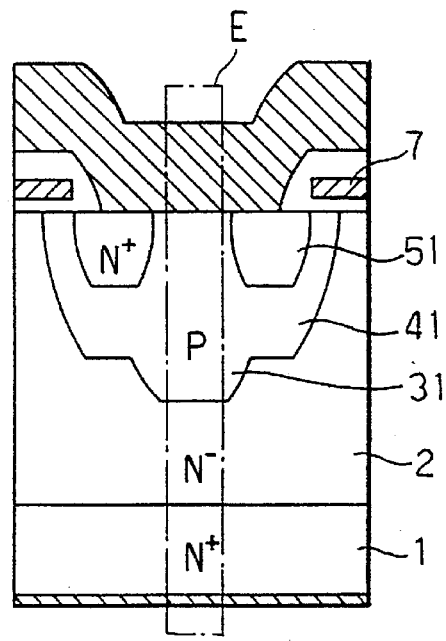
FIG. 14a  FIG. 14b
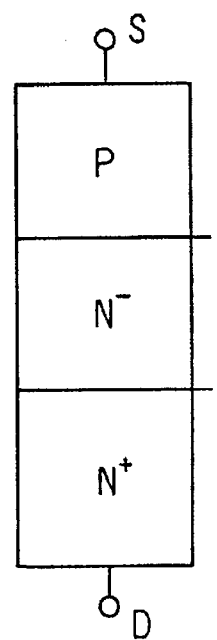
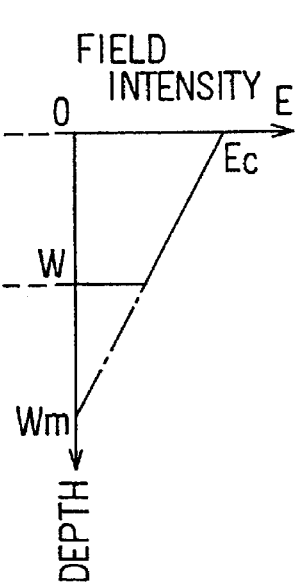

SEMICONDUCTOR DEVICE WITH CURRENT DETECTING FUNCTION AND METHOD OF PRODUCING THE SAME

This a division of application Ser. No. 8/038,958, filed Mar. 29, 1993, now U.S. Pat. No. 5,453,390.

BACKGROUND OF THE INVENTION

1. Field of the Invention

The present invention relates to a power semiconductor device having a current detecting function and a method of producing the same.

2. Description of the Related Art

The power semiconductor device is a device designed to let flow currents of power levels, such as those for driving motors to monitor conduction currents and to check for overcurrents. This requires the device to detect Currents flowing,therethrough or flowing through a load circuit connected thereto. There have been proposed a number of devices having such a current detecting function.

One such device is disclosed in U.S. Pat. No 4783690. This is a power semiconductor device comprising plurality of vertical doubled-diffused insulated gate transistors (DMOS cells) each having two kinds of well regions: a deep well region not wide enough to reach under a gate electrode and intended primarily to prevent a punch-through at a source region, and a channel well region shallower than the above well region and reaching a channel region immediately under the gate electrode to determine the threshold voltage of that channel region. The disclosed device has a principal current part having a plurality of integrated DMOS cells, and a current detection part having a plurality of integrated DMOS cells and branching part of the current flowing through the device for current detection. The principal current part and the current detection part Share the substrate as their drain. Gate electrodes are fed with the same potential, and source regions are incorporated in different channel regions to divide the source current therebetween. Because the DMOS cells of the principal current part and of the current detection part are formed in the same shape on the same chip using the same process, the current flowing through the principal current part is estimated using a source follower resistance to detect the current flowing through the DMOS cells constituting the current detection part.

When a power Semiconductor device is in use, its drain electrode is vulnerable to a surge voltage as well as to a fly-back voltage from driving under, a reactance load. The device is protected from such overvoltages generally by suitable means for breaking down the parasitic diode formed by a PN junction between the drain and well regions. In this manner, the voltage applied to the power semiconductor device is fixed in a safe operating range of the device.

One disadvantage of the disclosed semiconductor device having a current detecting function is a possible destruction of DMOS cells in its current detection part. The destruction can occur as follows: because the well region of the current detection part and that of the principal current part are formed in the same shape using the same process, the vertical reach-through voltage of one region is the same as that of the other region. That is, a reach-through occurring in the principal current part will likely entail a concurrent reach-through in the current detection part. Hence the possible destruction of DMOS cells in the current detection part having a lower current capacity than the DMOS cells in the principal current part.

SUMMARY OF THE INVENTION

It is therefore an object of the present invention to provide a semiconductor device comprising a current detection part having a higher breakdown voltage level than a principal current part, whereby cell destruction in the current detection part is prevented.

In carrying out the invention and according to one aspect thereof there is provided a power semiconductor device comprising: a first conductivity type semiconductor substrate of high density, the surface thereof having a first conductivity type layer of low density; a principal well region and a subordinate well region of a second conductivity type each, the two well regions being formed away from each other on the surface of the first conductivity type layer; a first conductivity type region of high density constituting a surface electrode region of a principal current part formed on the surface of the principal well region; and a first conductivity type region of high density formed on the surface of the subordinate well region and constituting a surface electrode region of a detection part for detecting currents in the principal current part; wherein the subordinate well region has a shallower junction depth than the principal well region.

According to another aspect of the invention, there is provided a method for producing a semiconductor device comprising the steps of: forming a principal well region and a subordinate well region of a second conductivity type each on a first conductivity type semiconductor substrate,of high density having on the surface thereof a first conductivity type layer of low density, the two regions being formed away from each other by ion implantation of impurities into the surface of the first conductivity type layer through masks having predetermined apertures; and forming a first conductivity type region of high density constituting a surface electrode region of a principal current part on the surface of the principal well region while forming a first conductivity type region of high density constituting a surface electrode region of a detection part on the surface of the subordinate well region, the detection part detecting currents in the principal current part; wherein the mask through which to form the subordinate well region has narrower apertures than the mask through which to form the principal well region.

The semiconductor device according to the invention has the principal well region and subordinate well region each containing the principal current part and the detection part. That is, the detection part and the principal current part share the substrate as their common electrode. The other electrode of the principal current part and that of the detection part are furnished, respectively, on the surfaces of the principal well region and of the subordinate well region.

Where junction depletion layers interposed between the principal, and the subordinate well regions and the first conductivity type region respectively reached the substrate of high density, a growing backward bias voltage between the two regions can lead to breakdown because of the increased depletion layer field. This phenomenon is known as a reach-through illustratively with unipolar vertical MOSFET's.

According to the invention, the subordinate well region is made shallower than the principal well region. It follows that a breakdown of cells can occur first in the principal current part and later in the detection part. This is because the principal current part has a longer distance between its well region and the substrate; that distance is greater with the detection part.

As outlined, the invention is characterized by the fact that the subordinate well region is made shallower than the principal well region. In other words, the layer immediately below the subordinate well region of the detection part is thicker than the layer immediately below the principal well region of the principal current part. This structure raises the breakdown voltage level for the detection part whose current capacity is small. As a result, the semiconductor device is protected from early breakdown in its detection part when overvoltages such as surge voltages are applied to the latter. The power semiconductor device of this constitution thus ensures high levels of reliability.

The method for producing the semiconductor device according to the invention involves producing the subordinate well region by use of the mask having narrower apertures than the mask for producing the principal well region. Using these masks allows the novel device constitution to be practiced without increasing the number of processes involved, whereby the reach-through withstand voltage level of the detection part is enhanced.

BRIEF DESCRIPTION OF THE DRAWINGS

FIG. 12 is a cross-sectional view taken on line 12—12 of the device in FIG. 9;

FIG. 13 is a cross-sectional view of a DMOS unit cell structure according to the invention;

FIG. 14a is a schematic view of the portion E in FIG. 13;

FIG. 14b is a view depicting a typical field intensity distribution pattern in the depth direction relative to the boundary between P region and $N^{31}$ region in FIG. 14a, the boundary being taken as the origin;

DETAILED DESCRIPTION OF THE EMBODIMENTS

Preferred embodiments of the invention will now be described with reference to the accompanying drawings.

Figure 1:
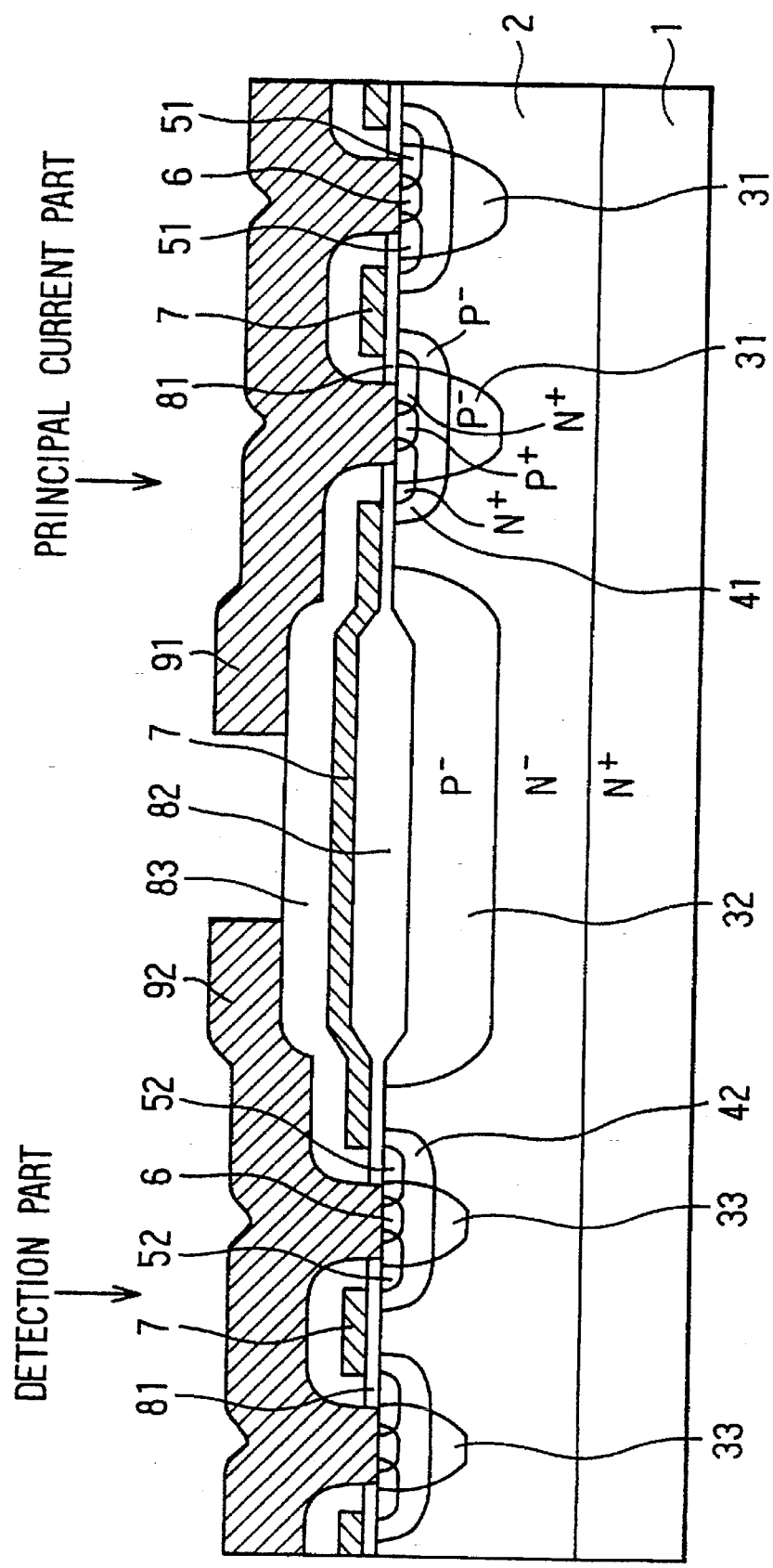
FIG. 1 is a cross-sectional view of a power semiconductor device practiced as a first embodiment of the invention.
Figure 2:
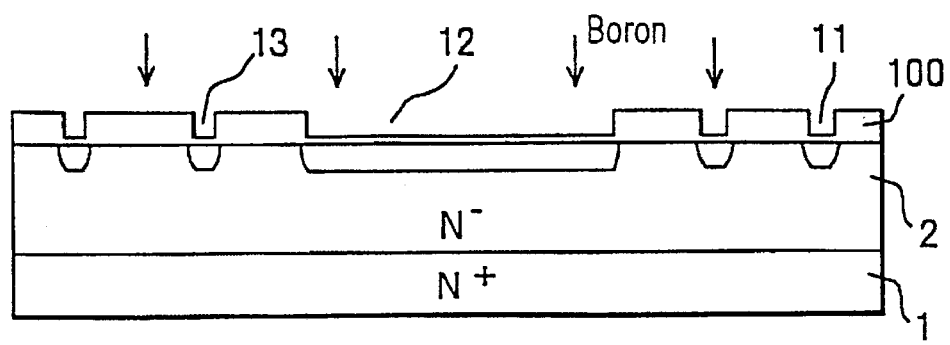
FIGS. 2 through 5 are cross-sectional views illustrating processes for producing the first embodiment of FIG. 1.

FIG. 1 is a cross-sectional view of a power semiconductor device practiced as the first embodiment of the invention. In FIG. 1, reference numeral 1 is an $N^+$ silicon substrate (semiconductor substrate); 2 is an $N^-$ epitaxial layer; 31 is a deep $P^-$ well region of a principal current part (defining the bottom of the principal well region of the invention); 32 is a round $P^-$ well region separating the principal current part from the detection part; 33 is a deep $P^-$ well region of the detection part (defining the bottom of the subordinate well region of the invention); 41 is a $P^-$ channel well region of the principal current part (forming part of the principal well region of the invention); 42 is a $P^-$ channel well region of the detection part (forming part of the subordinate well region of the invention); 51 is an $N^+$ source region of each DMOS cell constituting the principal current part (surface electrode region of the invention); 52 is an $N^+$ source region of each DMOS cell constituting the detection part (surface electrode region of the invention); 6 is a $P^+$ contact region; 7 is a gate electrode made of doped polysilicon; 81 is a gate insulation film made of a silicon oxide film; 82 is a thick silicon oxide film; 83 is a layer insulation film made illustratively of BPSG; and 91 and 92 are electrodes made of aluminum.

The $N^+$ source region 51, together with the $P^-$ channel well region 41, is formed on the principal well region of the principal current part, i.e., on the surface of a $P^-$ well composed of the $P^-$ well region 31 and $P^-$ channel well region 41, by double ion implantation through the apertures of the gate electrode 7. The $N^+$ source region 52, together with the $P^-$ channel well region 42, is formed on the subordinate well region of the detection part, i.e., on the surface of a $P^-$ well composed of the $P^-$ well region 33 and $P^-$ channel well region 42, also by, double ion implantation through the apertures of the gate electrode 7. The round $P^-$ well region 32 is formed concurrently with the deep $P^-$ well regions 31 and 33.

With the first embodiment, the $P^-$ well region 33 of the detection part is about 3.4 μm deep and the $P^-$ well region 31 of the principal current part is about 3.6 μm deep. This structure raises the reach-through withstand voltage level of the $P^-$ well region 33-higher than that of the $P^-$ well region With the first embodiment, a large number of DMOS cell are disposed on the chip. The detection part for detecting currents has a small number of channel well regions 42 each substantially square horizontally. On top of the channel well regions 42 are the gate electrodes 7 of a lattice pattern having the apertures for double ion implantation. The principal current part for controlling principal currents has a large number of channel well regions 41 each substantially square horizontally. On top of the channel well regions 42 are also the gate electrodes 7 of the lattice pattern having the apertures for double ion implantation. The gate electrodes 7 of the principal current part and of the detection part are interconnected so as to carry the same potential.

Figure 3:
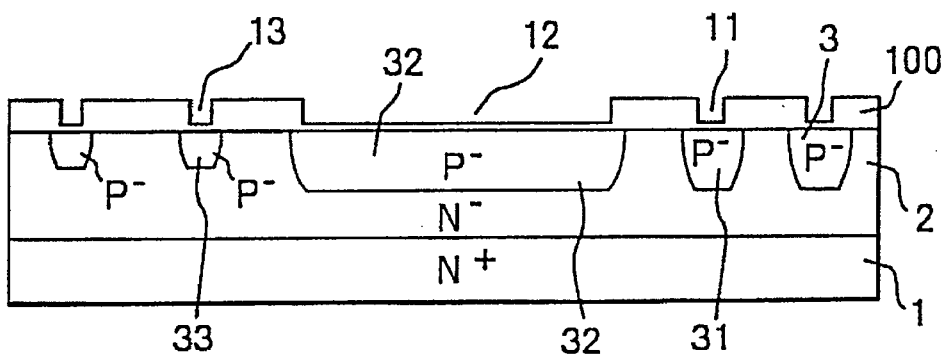

How the semiconductor device above is produced will now be described in detail with reference to FIGS. 1 through 5. As shown-in FIG. 2, the $N^+$ silicon substrate 1 having a resistivity of 0.02 Ω.cm or less is first prepared. The substrate i is covered with the $N^-$ epitaxial layer 2 of 0.5 to $1.0 \times 10^{16}$ atoms/cm$^3$ having a thickness of 7 to 15 82 m. Thereafter, a silicon: oxide film 100 about 7,000 Å thick is formed on the $N^-$ epitaxial layer 2. With the silicon oxide film 100 furnished, grooves 11, 12 and 13 are formed by photo-etching over that film 100. Through the grooves 11, 12 and 13, boron ions are implanted in $3 \times 10^{13}$ doses/cm$^2$ at 60 keV. Next, as depicted in FIG. 3, a drive-in process is effected (at 1,170° C. for 4 hours with $N_2$) to form the deep $P^-$ well regions 31, and 33 as well as the round $P^-$ well region 32.

The width of the groove 11 on the silicon oxide film 100 for forming the well region 31 is 3.6 μm wide, and the groove 13 for producing the well region 33 is 2.0 μm wide. These grooves cause the deep P⁻ well region 33 for the detection part to be about 3.4 μm deep when formed and the deep P⁻ well region 31 for the principal current part to be about 3.6 μm deep. The round P⁻ well regions 32 surround the detection part, i.e., the P⁻ well regions 33, at predetermined intervals in a substantially rectangular pattern.

Figure 4:
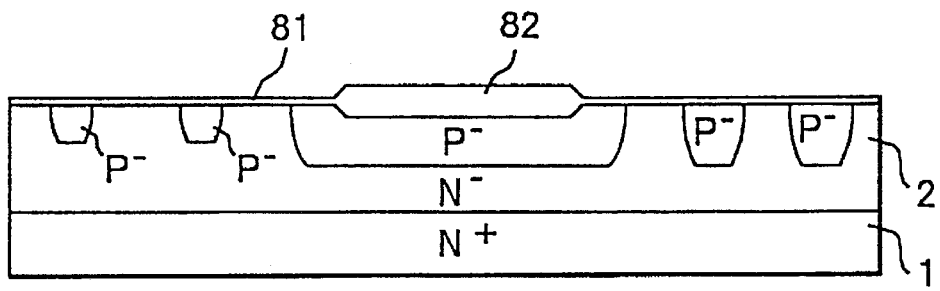

As illustrated in FIG. 4, the silicon oxide film 100 is then removed, followed by formation of the thick silicon oxide film (field oxide film) 82 about 9,000 Å thick. After its formation, the silicon oxide film 82 is removed except for the portions over the P⁻ well regions 32. Thereafter, the gate insulation film 81 about 600 Å thick is formed by thermal oxidation.

Figure 5:
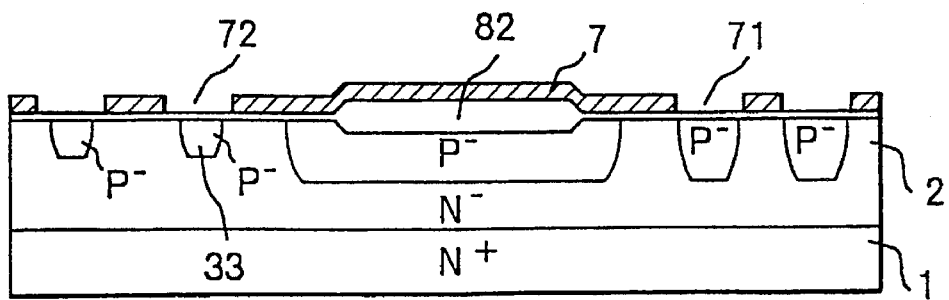

Next, as shown in FIG. 5, the gate electrodes 7 are formed by the photo-etching of a polysilicon film deposited ed by the LPCVD method to 5,000 to 10,000 Å in depth and subjected to phosphorus diffusion. The gate electrodes 7 in the detection part have apertures 72 surrounding the well region 33.

As indicated in FIG. 1, boron ions are then implanted in $6 \times 10^{13}$ to $9 \times 10^{13}$ doses/cm² at 40 keV, followed by a drive-in process carried out at 1,170° C. for about 60 minutes. This forms the P⁻ channel well regions 41 and 42. After the boron ion implantation, phosphorus ions are implanted using a mask patterned by photolithography. The phosphorus ion implantation forms the N⁺ region 51 over the P⁻ well region 41 and the N⁺ region 52 over the P⁻ well region 42. After the mask is removed, boron ions are again implanted to form the well-contacting P⁺ region 6 in the middle of the surface of the well regions 41 and 42. The N⁺ source regions 51 and 52 as well as the P⁺ contact regions 6 are activated through annealing in an N₂ atmosphere. The edges on the gate electrode side of the N⁺ regions 51 and 52 are defined not by the mask shape but by the edges of the gate electrodes 7. As a result, the DMOS channel length under the gate electrodes 7 is determined by the difference in lateral diffusion width between the two passes of ion implantation: one for forming the P⁻ channel well and the other for producing the N⁺ region. Then the layer insulation film 83 made of a BPSG film is deposited all over the surface by the CVD method. At the same time, appropriate portions of the layer insulation film 83 are removed to form contact holes. Then the Source electrodes 91 and 92 are formed from aluminum. Thereafter, a gate electrode pad (not shown) to be connected to the gate electrodes 7 through holes, not shown, is formed. With the gate electrode pad furnished, a drain electrode part, not shown and made of Ti/Ni/Au, is formed on the back of the substrate 1. This completes the semiconductor device having integrated vertical DMOS power transistors whose structure is sketched in FIG. 1.

How the first embodiment above works will now be described. The source electrode 91 is connected to ground. The substrate 1 is connected to a positive potential source via a drain electrode part and a load, both not shown. When a positive common control voltage is applied to the gate electrodes V shared by the principal current part and the detection part, the source regions 51 and 52 conduct to the N⁺ substrate 1 through N-channel arrangements on the surfaces of the well regions 41 and 42, respectively. The well region 41 is biased at the same potential as the source region 51, and the well region 42 is biased at the same potential as the source region 52. The DMOS cells of the detection part are substantially equal to those of the principal current part in terms of threshold voltage Vt and channel mutual conductance. Thus connecting the source region 52 to ground via a low resistance makes the potential of that region proportional to the current flowing through the principal current part, whereby the current of the principal current part becomes known. The round P⁻ well region 32 prevents breakdown that may occur as a result of the concentration of depletion layer fields in the surface of the epitaxial layer 2 between principal current part and detection part. The edges of the source electrodes 91 and 92 are formed above the thick silicon oxide film 83. This structure prevents any cracks that may be caused in these edges by thermal stress, from reaching the P⁻ well region 32.

Consider the situation in which a reactance load such as a motor is driven under control. In that case, a high spike voltage is induced in the load circuit when the device is turned off. The spike voltage applies backward bias to the PN junction between the well regions 31 and 33 on the one hand, and the epitaxial layer 2 on the other in the semiconductor device. This causes the depletion layer to extend from the PN junction toward the epitaxial layer 2 which is of the lower density. Having reached the N³⁰ substrate 1, the extended depletion layer raises the electric field over the PN junction surface. With the first embodiment, the above phenomenon of avalanche breakdown called a reach-through occurs first in the principal current part. This is because the bottom of the well region 33 in the detection part is made shallower than that of the well region 31 in the principal current part. Thus the detection part, of which the reach-through withstand voltage level is low, is protected from destruction.

As described, producing the first embodiment involves implanting boron ions through the wide and the narrow grooves 11 and 13 on the silicon oxide film 100 acting as the mask, followed by the drive-in process. This forms the relatively deep and shallow P⁻ well regions 31 and 33. The surface of the relatively shallow P⁻ well region 33 is provided with the N⁺ source region 52 acting as an electrode for the detection part, and the surface of the relatively deep P⁻ well region 31 is furnished with the N⁺ source region 51 acting as an electrode for the principal current part. This structure improves the reach-through withstand voltage level for the DMOS cells of the detection part without adding further processes to carry out for production, whereby early destruction of the detection part, which is characteristic of the prior art, is prevented reliably.

Figure 6:
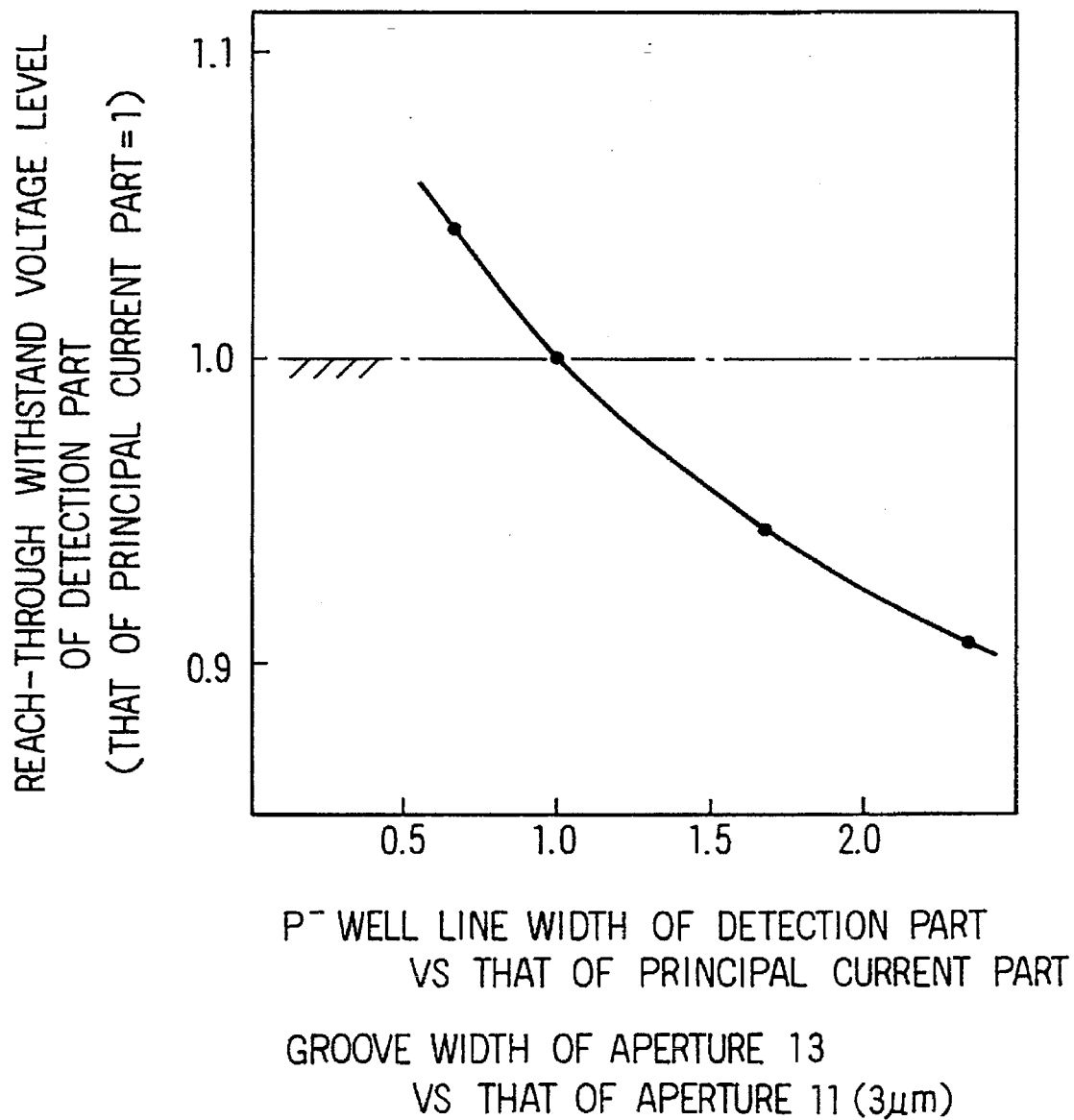
FIG. 6 is a characteristic view representing the relationship between mask aperture groove width and reach-through withstand voltage level in connection with the first embodiment.

FIG. 6 is a characteristic view illustrating typical ratios of groove widths of mask apertures to the reach-through withstand voltage level of the detection part (principal current part is assumed to have the ratio of 1) in effect where the groove width for the apertures 11 of the mask 100 for the P⁻ well region 31 is fixed at 3 μm while the groove width for the apertures 13 of the mask 100 for the P⁻ well region 33 is varied. As illustrated, the reach-through withstand voltage level of the detection part is enhanced by making the groove width for the apertures 13 of the mask 100 for the P⁻ well region 33 narrower than the groove width for the P⁻ well region 31 of the principal current part. The enhanced reach-through withstand voltage level protects the detection part from getting destroyed by breakdown.

Figure 7:
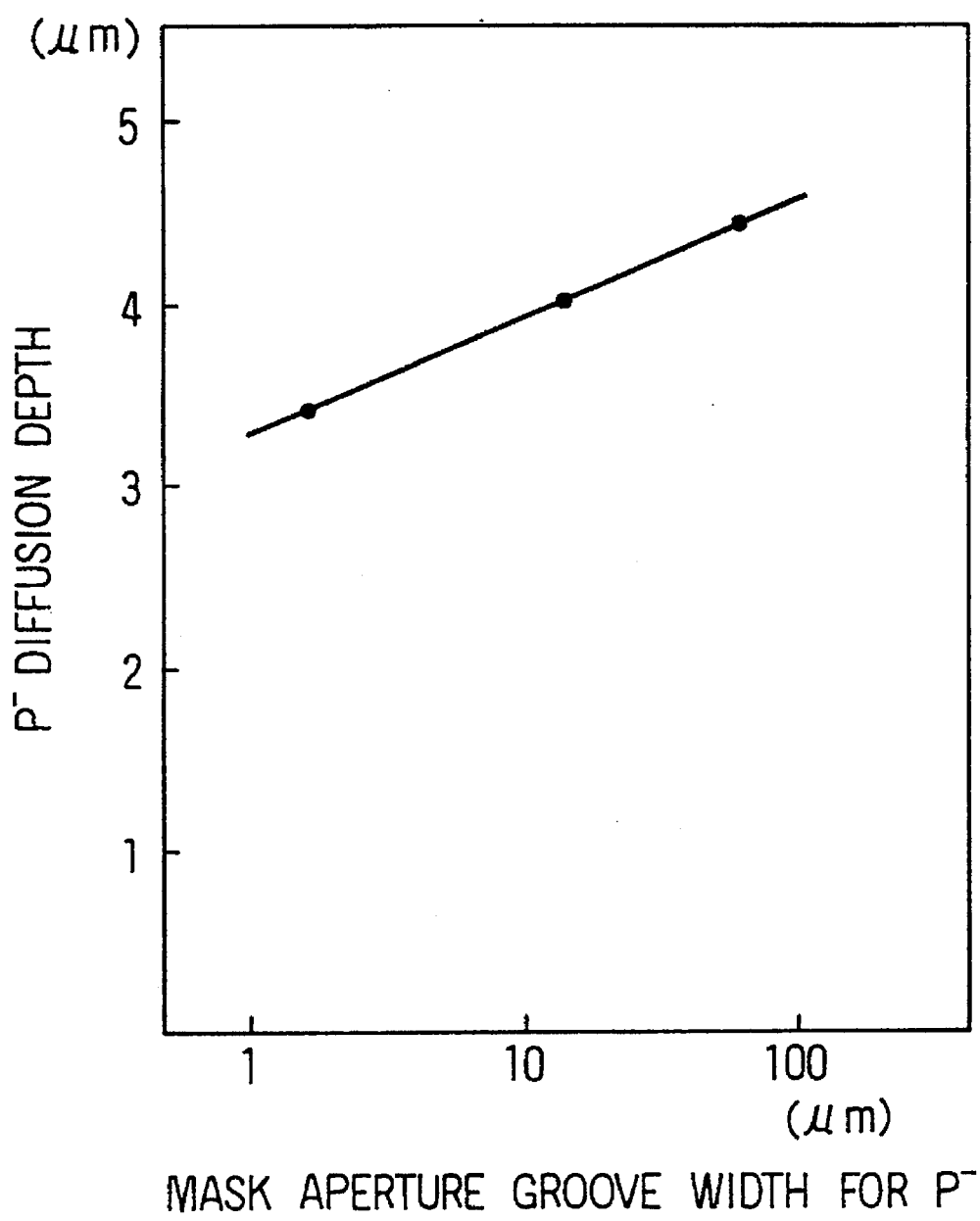
FIG. 7 is a characteristic view denoting the relationship between mask aperture groove width and well depth in connection with the first embodiment.

FIG. 7 is a characteristic view depicting experimentally obtained results of the relationship between mask aperture groove width and P⁻ well region. Measurements were taken from experiments on condition that the density and the thickness of the. epitaxial layer 2 were $5 \times 10^{15}$ atoms/cm³ and 7.6 μm respectively, that boron ions were implanted at an acceleration voltage of 60 keV, and that the drive-in process was carried out at 1,170° C. for 240 minutes. FIG.

Figure 8:
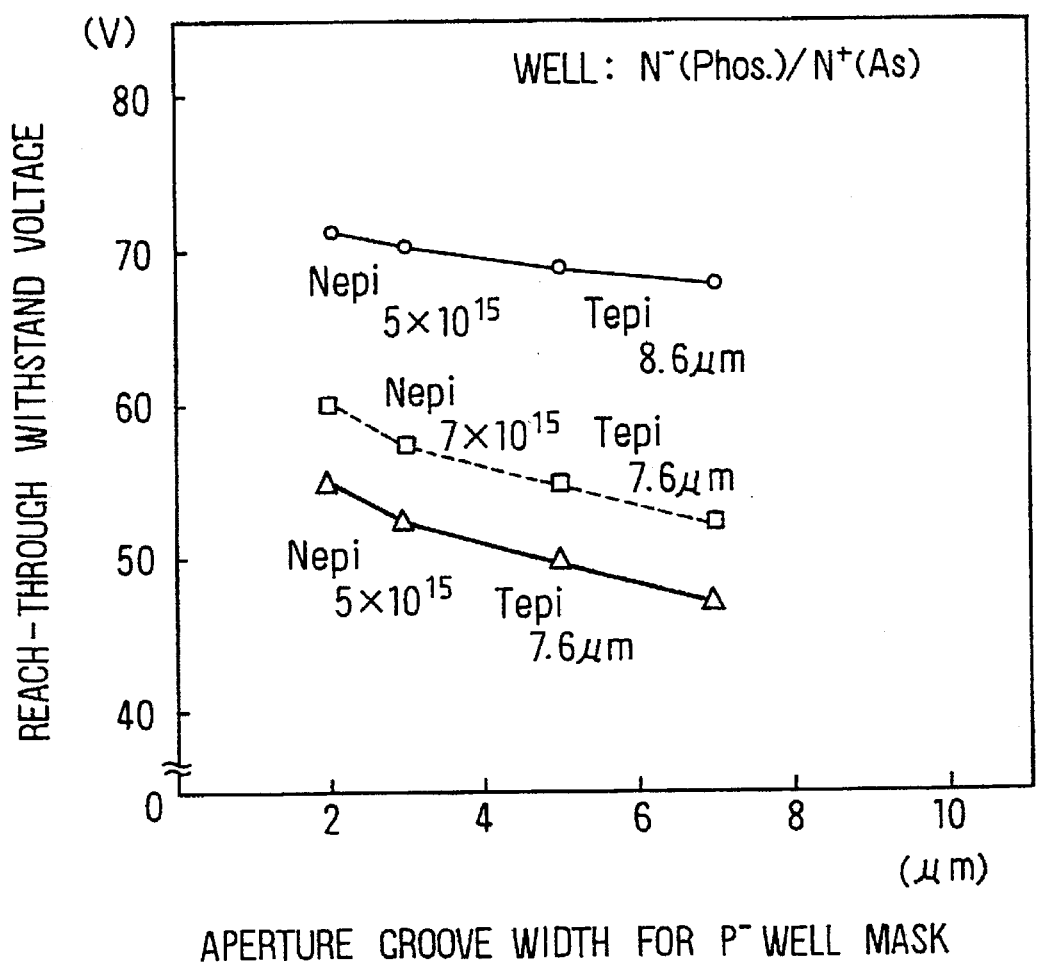
FIG. 8 is a characteristic view showing the relationship between mask aperture groove width and reach-through withstand voltage level in effect when epitaxial layer conditions are varied in connection with the first embodiment.

8 is a characteristic view showing experimentally obtained results of the relationship between mask aperture groove width and reach-through withstand voltage level under various epitaxial layer conditions. From FIGS. 7 and 8, it can be seen that the diffusion depth of the P⁻ well region, even under the same conditions of production, varies depending on the mask aperture groove width. The dependency of the P⁻ diffusion depth on the mask aperture groove width is utilized in controlling the P⁻ well depth through a single process (i.e., one pass) of P⁻ ion implantation. In this manner, portions of different breakdown withstand voltage levels may be produced on the same substrate.

The first embodiment described above is an application of the invention to a power semiconductor device wherein part of the DMOS cells constituting the semiconductor device are used to branch the current flowing therethrough for detection purposes. Alternatively, the invention may also be applied to semiconductor devices having a current detecting function such as those disclosed in Japanese Patent Laid-Open No. SHO/63-12175 and in Japanese Patent La-id-Open Application No. HEI3-179,654. The current detection scheme adopted in these power semiconductor devices disclosed differs from the current branching arrangement. Under the alternative current detection scheme, the detection part is disposed close to vertical DMOS cells constituting the principal current part. Then the detection part is arranged directly to detect voltage drops caused by the intrinsic channel resistance in the DMOS cells. What follows is a description of how to apply the invention to the above voltage detection method as the second embodiment.

Figure 9:
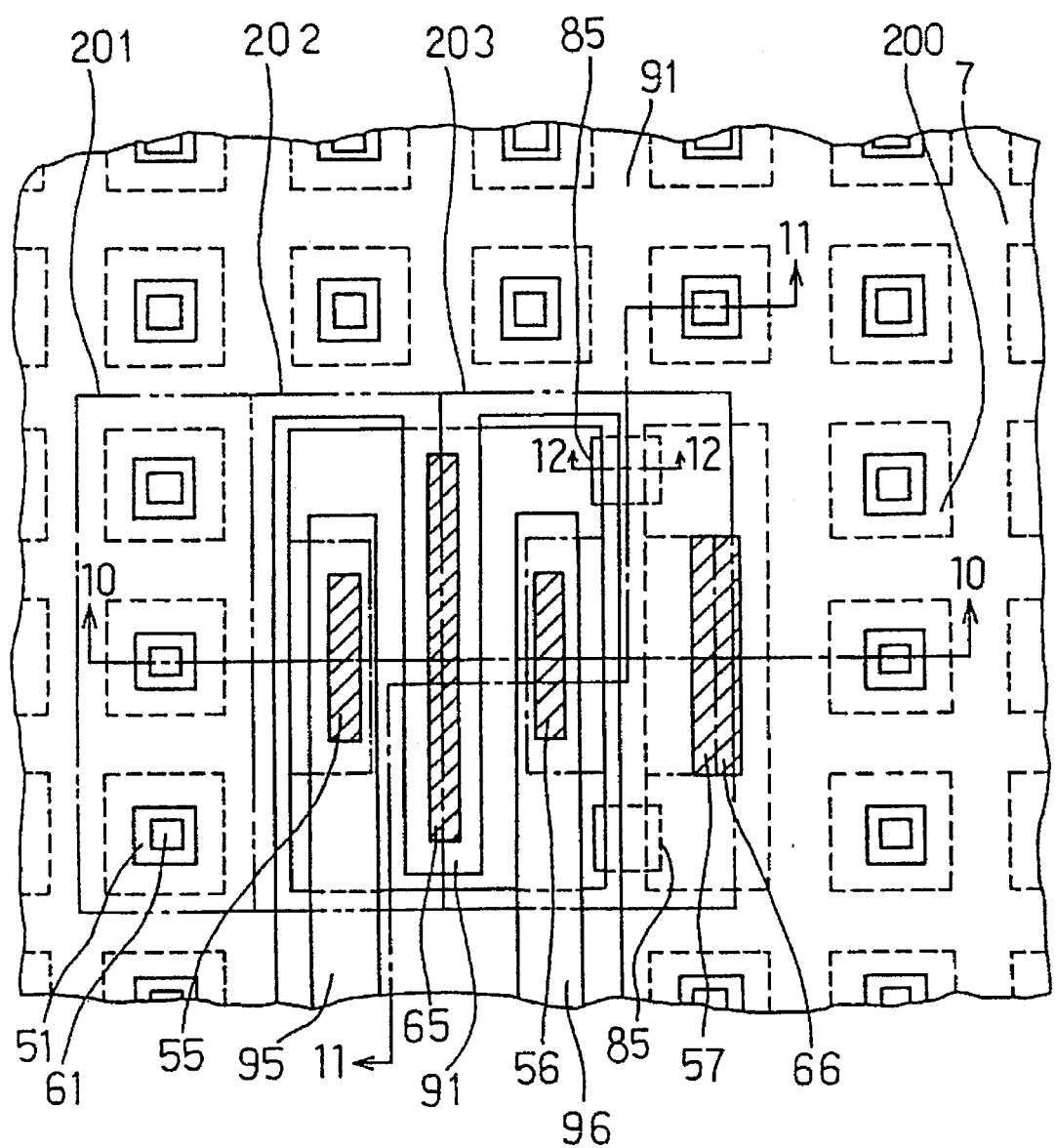
FIG. 9 is a plan view of a power semiconductor device practiced as a second embodiment of the invention.
Figure 10:
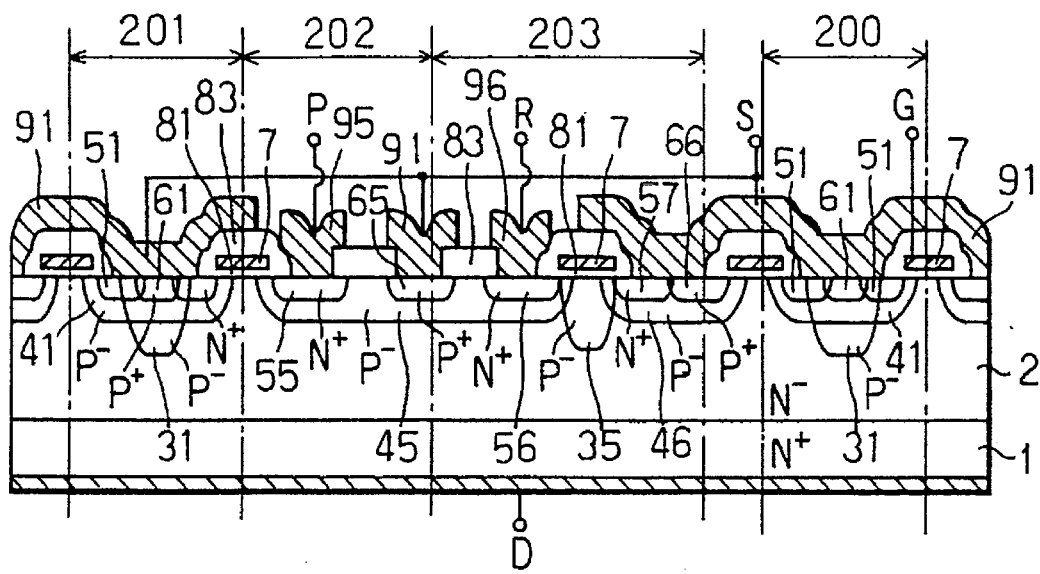
FIG. 10 is a cross-sectional view taken on line 10—10 of the device in FIG. 9.
Figure 11:
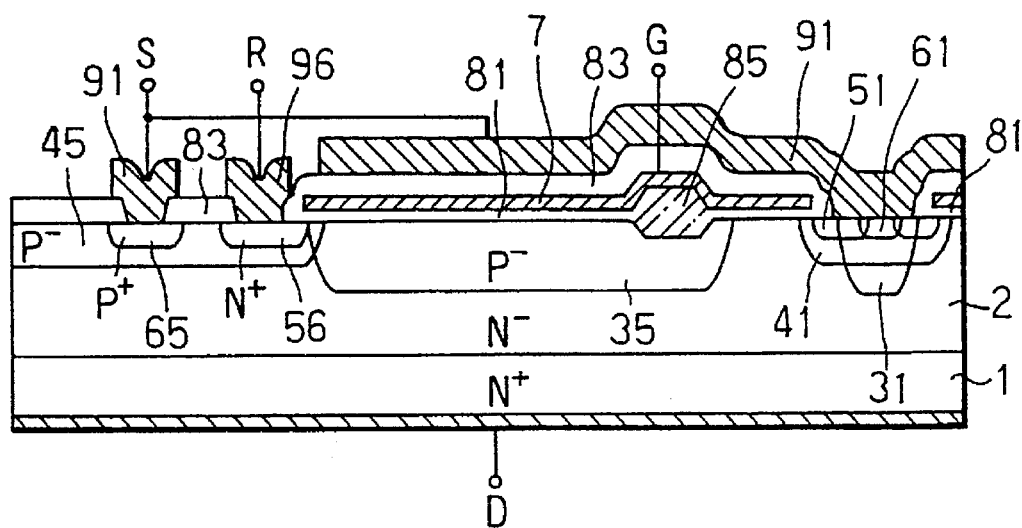
FIG. 11 is a cross-sectional view taken on lane 11—11 of the device in FIG. 9.

FIGS. 9 through 12 are views showing various aspects of the second embodiment as produced. FIG. 9 is a plan view of the second embodiment; FIG. 10 is a cross-sectional view taken on line 10—10 in FIG. 9; FIG. 11 is a cross-sectional view taken on line 11—11 in FIG. 9; and FIG. 12 is a cross-sectional view taken on line 12—12 in FIG. 9.

In general terms, the power semiconductor device practiced as the second embodiment of the invention includes a principal current part having a plurality of N-channel vertical MOSFET DMOS unit cells 200. Part of the DMOS cells 200 constitute a current-detected part 201, a current-detecting part 202 and a compensation resistance part 203 which is a horizontal MOSFET.

Components of the principal current part (including the current-detected part 201) are described below in the order of their production. An N⁻ epitaxial layer 2 is formed on the Surface of the N⁺ silicon substrate 1. A deep P⁻ well region (bottom of the principal well region of the invention) is produced for each unit cell position. Then the surface of the epitaxial layer 2 is oxidized to form a gate insulation film 81. Produced on top of the gate insulation film 81 is a gate electrode 7 patterned to a predetermined shape. The gate electrode 7 is used as the mask through which are performed two passes of ion implantation. This produces a P⁻ channel well region (part of the-principal well region of the invention) and an N⁺ source region 51 for each unit cell position. A P⁺ contact region 61 is formed in the middle of each unit cell. Thereafter, a layer insulation film 83 made illustratively of BPSG is deposited, contact holes are made, aluminum films are furnished, a source electrode 91 is produced by patterning, and a drain electrode arrangement is formed at the back of the substrate 1. These processes combine to produce the semiconductor device shown in FIGS. 9 and 10. The source electrode 91 is connected to a source terminal S, the gate electrode 7 to a gate terminal G, and the drain electrode to a drain terminal D.

The constitution of the current-detecting part 202 and that of the compensation resistance part 203 are described below in the order in which their components are produced. Production of the deep P⁻ well region 31 in the principal current part is accompanied concurrently by the formation of the region that acts as the horizontal MOSFET of the compensation part 203 as well as a deep P⁻ well region 35 (defining the bottom of the subordinate well region of the invention) that corresponds to the region acting as a channel stopper 85. After this, a thick silicon oxide film (field oxide film) also acting as the channel stopper 85 is formed near the edge of the deep P⁻ well region 35 (see FIGS. 9, 11 and 12) at the same time that another thick silicon oxide film (field oxide film) is formed in correspondence to an electrode pad region, not shown. The thick silicon oxide films are produced illustratively by the LOCOS method. Then the gate insulation film 81 is formed and the gate electrode 7 is disposed as described. Formation of the P⁻ channel well region 41 in the principal current part using the gate electrode 7 as the mask entails concurrent production of a P⁻ channel well region 45 in the current-detecting part 202 and a P⁻ channel well region 46 in the compensation resistance part 203. In the compensation resistance part 203, the P⁻ channel well regions 45 and 46 are bridged by the deep P⁻ well region 35 under the gate electrode 7 and channel stopper 85 (see FIGS. 10 and 12), whereby the horizontal MOSFET structure is provided. Implanting ions through the gate electrode 7 as the mask produces an N⁺ probe region 55 and an N⁺ drain region 56 in the P⁻ channel well region 45, and an N⁺ source region 57 in the P⁻ channel well region 46, at the same time that the N⁺ source region 51 of the principal current part is formed. P⁺ contact regions 65 and 66 are formed at the same time that the P⁺ contact region 61 of the principal current part is produced. Thereafter, the layer insulation film 83 made illustratively of BPSG is deposited; the contact holes are made; the aluminum films are furnished; and the patterning process is used to form the source electrode 91, a probe electrode 95 and a compensation resistance electrode 96. With the drain electrode of the principal current part formed at the back of the substrate 1, the device shown in FIGS. 9 through 12 is completed. The source electrode 91 is connected to a source terminal S, the probe electrode 95 to a probe terminal P, the compensation resistance electrode 96 to a compensation resistance terminal R, and the gate electrode 7 to a gate terminal G.

In the current-detecting part 202 and compensation resistance part 203, the deep P⁻ well region 35 is formed only under the gate electrode 7 and channel stopper 85 of the compensation resistance part 203, the region 35 serving as the bridge connecting the P⁻ channel well regions 45 and 46. Above the deep P⁻ well region 35, the gate line width (gate length) of the gate electrode 7 and the LOCOS oxide film width in the horizontal MOSFET are adjusted so that P⁻ ions will not be implanted in an overlapping manner when the P⁻ channel well regions 45 and 46 are later formed. Consider the bottom of the channel stopper 85 as an example. As shown in FIG. 12, the mask width L2 for forming the LOCOS oxide film.(channel stopper) 85 is made wider than the mask width L1 for forming the deep P⁻ well region 35, with mask misalignment taken into account, so that the P⁻ well region 35 and the P⁻ channel well regions 45 and 46 are connected by lateral diffusion under the LOCOS oxide film 85. As with the first embodiment, the mask width L1 for forming the P⁻ well region 35 is preferably made narrower than the mask width for forming the deep P⁻ well region 31 of the principal current part. Because the reach-through withstand voltage level of the P⁻ well region 35 can be improved (as will be described later), the mask width L1 may be set equal to or somewhat wider than the mask width for forming the P⁻ well region 31.

Although the second embodiment does not have a deep P⁻ well region established for the P⁻ channel well regions 45 and 46, that deep P⁻ well region may be formed using a mask width narrower than that for forming the P⁻ well region 31 of the principal current part, as with the first embodiment.

The principle of current detention with the second embodiment operating under the voltage detection scheme above utilizes the channel resistance of a double diffusion type vertical MOSFET constitution. That principle will now be described in more detail.

In the unit cells (current-detected part 201) constituting the principal current part, electrons flow through the source terminal S, source electrode 91, N⁺ source region 51, channel arrangement, N⁻ epitaxial layer 2, N⁺ substrate, drain electrode and drain terminal D, in that order. A voltage drop over the channel arrangement of the current-detected part 201 is detected from the path made of the N⁺ probe region 55, probe electrode 95 and probe terminal P. The detected voltage drop is output as a voltage drop signal between probe terminal P and source terminal S. Appearing between probe terminal P and source terminal S, the voltage drop signal is compensated as needed for the channel resistance temperature or for the gate voltage dependency by use of the horizontal MOSFET channel resistance in the compensation resistance part 203. This arrangement enhances the level of accuracy at which to detect the current.

Described below are the reasons that the setup of FIGS. 9 through 12 allows the reach-through withstand voltage level of the current-detecting part 202 and compensation resistance part 203 to be higher than that of the unit cells (current-detected part 201) 200 of principal current part.

First to be described is the reason why the reach-through withstand voltage level of the current-detecting part 202 is made higher than that of the unit cells 200 of the principal current part. FIG. 13 is a cross-sectional view of one the DMOS unit cells constituting the principal current part, and FIG. 14a is a schematic view of the portion E in FIG. 13. FIG. 14b is a view depicting a typical field intensity distribution pattern in the depth direction relative to the boundary between P region and N⁻ region in FIG. 14a, the boundary being taken as the origin. For the sake of simplicity, a one-sided abrupt junction structure is approximated here, and it is assumed that there occurs no depletion layer extension from the PN⁻ junction to the P region or into the N⁺ region. When a positive voltage is applied to the drain terminal D, a maximum field strength develops at the origin. When the field intensity becomes equal to the critical field of silicon, an avalanche breakdown takes place. The voltage $V_B$ in effect at this point is given as $$V_B = \tfrac{1}{2} \times (2 - W/Wm) \times Ec \times W \tag{1}$$

where, W stands for the thickness of the N⁻ region and Wm for the thickness of the depletion layer extending from the origin toward the N⁻ region when the N⁺ region is replaced by the N⁻ region. The equation (1) above shows that the reach-through withstand voltage level decreases as the thickness W is reduced.

In FIG. 10, comparing the P well junction depth of the current-detecting part 202 with that of the principal current part reveals this: that the deep P⁻ well region 31 is formed in the principal current part, while only the shallow P⁻ channel well region 45 constituting the channel arrangement is diffused in the current-detecting part 202. In other words, the thickness W of the N⁻ epitaxial layer 2 under the P⁻ region is less in the principal current part than in the current-detecting part 202. It follows that the reach-through withstand voltage level of the current-detecting part 202 is higher than that of the principal current part.

The improvement of the reach-through withstand voltage level for the current-detecting part 202 is implemented simply in one of two ways: by not forming apertures on the mask so that no deep P⁻ well will be formed in the current-detecting part 202, as described; or by forming the mask apertures narrower than those for the principal current part so that the P⁻ well formed in the current-detecting part 202 will be shallower than that in the principal current part.

Figures 15A, 15B:
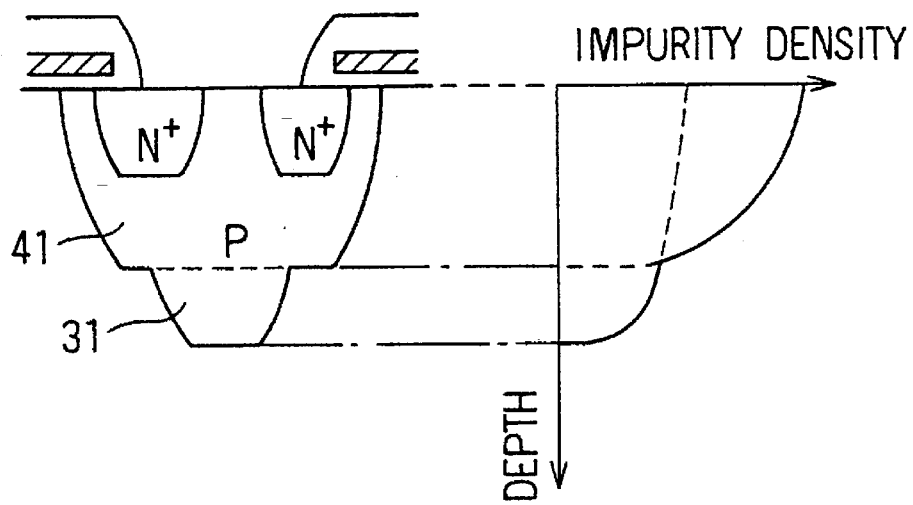
FIG. 15a is a cross-sectional structural view of a DMOS unit cell according to the invention.
FIG. 15b is a view illustrating an impurity density distribution pattern of the P region in FIG. 15a in the depth direction.
Figures 16A, 16B:
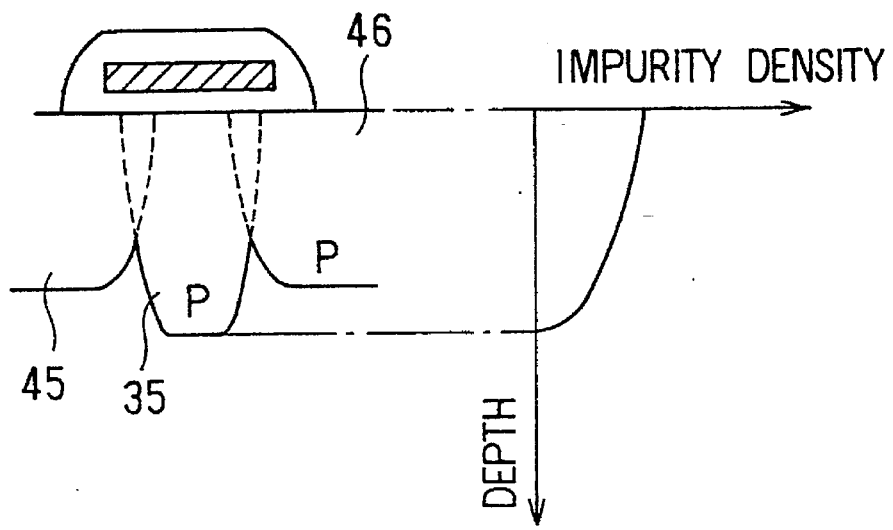
FIG. 16a is a cross-sectional structural view of a horizontal MOSFET in a compensation resistor according to the invention.
FIG. 16b is a view showing an impurity density distribution pattern of the P region in FIG. 16a in the depth direction.

Described below is the reason why the reach-through withstand voltage level of the compensation resistance part 203 is made higher than that of the unit cells 200 constituting the principal current part. As shown in FIGS. 10 and 12, the compensation resistance part 203 comprises the deep P⁻ well region 35 that is formed concurrently with the deep P⁻ well region 31 of the principal current part. The junction depth of the P⁻ well region 35 is discussed below in more detail with reference to FIGS. 15 and 16. FIG. 15a is a cross-sectional view showing the P⁻ well structure of a DMOS unit cell 200 in the principal current part, and FIG. 16a is a cross-sectional view depicting the P⁻ well structure of a horizontal MOSFET in the compensation resistance part 203. FIG. 15b is a view illustrating an impurity density distribution pattern of the structure of FIG. 15a in the depth direction, and FIG. 16a is a view showing an impurity density distribution pattern of the structure of FIG. 15a in the depth direction.

The thermal diffusion after ion implantation of impurities is expressed by the diffusion equation:

$$F = -D \cdot (\partial C/\partial X) \tag{2}$$

where, F stands for the number of dopants passing through the unit area per unit time, C for the number of dopants per unit volume, and D for a diffusion coefficient.

Comparing the surface density of FIG. 15b with that of FIG. 16b shows the former to be higher than the latter. This is because, in the DMOS unit cells 200 of the principal current part, the ion implantation for forming the deep P⁻ well region 31 is supplemented in an overlapping manner by the ion implantation for producing the P⁻ channel well region 41. In the compensation resistance part 203, the deep P⁻ well region 35 and the P⁻ channel well regions 45 and 48 are bridged, though the surface of the deep P⁻ well region 35 is not subject to-the double ion implantation. Thus the partial differential term in the equation (2) is greater for the DMOS unit cells of the principal current part than for the compensation resistance part 203. As a result, the junction depth of the deep P⁻ well region 31 in the principal current part becomes greater than that of the deep P⁻ well region 35 in the compensation resistance part 203. For the same reason, the junction depth of the P⁻ well region 35 under the channel stopper 85 becomes less than that of the deep P⁻ well region 31 in the principal current part.

Thus the junction depth of the P well region 35 in the compensation resistance part 203 shown in FIGS. 10 and 12 is less than that of the P well region 31 in the principal currents part, and the thickness W of the N⁻ epitaxial layer 2 under the P well region is less in the principal current part than in the compensation resistance part. Consequently, as indicated by the equation (1), the reach-through withstand voltage level of the compensation resistance part 203 becomes higher than that of the principal current part.

The improvement of the reach-through withstand voltage level for the compensation resistance part implemented during production of the deep P⁻ well region 31 in the principal current part. During that time, the mask width for forming the deep P⁻ well region 35 in the compensation resistance part 203 is set appropriately relative to the horizontal MOSFET gate line width or to the LOCOS oxide film width. Where it is desired to make the P⁻ well region 35 in the compensation resistance part 203 shallower than the P⁻ well region 31 in the principal current part, the mask width for forming the deep P⁻ well region 35 in the compensation resistance part 203 need only be made narrower than the mask width for producing the P⁻ well region 31 in the principal current part, as with the first embodiment. Alternatively, the mask width for forming the deep P⁻ well region 35 in the compensation resistance part 203 is set equal to or somewhat wider than the mask width for forming the P⁻ well region 31 in the principal current part. The alternative procedure, thanks to the difference in surface impurity density involved as described, also makes the P⁻ well region 35 in the compensation resistance part 203 shallower than the region 31 in the principal current part. Furthermore, the fact that the P⁻ channel well region does not overlap above the P⁻ well region 35 in the compensation resistance part 203 allows the depletion layer to extend fully toward the P⁻ well region from PN junction between P⁻ well region and n⁻ region. This is another factor contributing to improving the reach-through withstand voltage level for the compensation resistance part 203.

With the second embodiment, as described, the well region bottom (defined by the bottom of the P⁻ channel well region 45) of the current-detecting part 202 and the well region bottom (defined by the bottom of the P⁻ well region 35) of the compensation resistance part 203 are made shallower than the bottom of the well region 31 in the principal current part. This constitution encourages a reach-through to occur first in the principal current part. With no reach-through taking place in the current-detecting part 202 or in the compensation resistance part 203, these parts are protected from destruction despite their low dielectric strengths. As with the first embodiment, the second embodiment enhances the reach-through withstand voltage level of the current detection side, whereby early destruction of the detection part, which is characteristic of the prior art, is prevented unfailingly.

Although the description above contains many specificities, these should not be construed as limiting the scope of the invention but as merely providing illustrations of the presently preferred embodiments of this invention. For example, the invention is applied not only to the unipolar power semiconductor device comprising DMOS unit cells, as described above, but also to IGBT's of a bipolar DMOS structure as well as to bipolar transistors.

Thus the scope of the invention should be determined by the appended claims and their legal equivalents, rather than by the examples given.

What is claimed is:

1. A semiconductor device a comprising:
a first conductivity type semiconductor substrate having a heavily doped semiconductor layer and a lightly doped semiconductor layer, the lightly doped semiconductor layer defining a main surface of said semiconductor substrate;
a principal well region and a subordinate well region each being of a second conductivity type, said principal and subordinate well regions being spaced apart from each other at said main surface of said semiconductor substrate;
a heavily doped first conductivity type region disposed at a surface of said principal well region and defining a surface electrode region of a principal current part of said semiconductor device; and
a heavily doped first conductivity type region disposed at a surface of said subordinate well region and defining a surface electrode region of a detection part of said semiconductor device, said detection part for detecting currents in said principal current part;
wherein said subordinate well region has a shallower junction depth than said principal well region.

2. A semiconductor device according to claim 1, wherein said principal current part has a first vertical DMOS structure, and wherein said principal well region comprises a first channel well region of said second conductivity type defining a channel arrangement of said first vertical DMOS structure, and a first well region of said second conductivity type having a greater junction depth than said first channel well region.

3. A semiconductor device according to claim 2, wherein said detection part has a second vertical DMOS structure, and wherein said subordinate well region comprises a second channel well region of said second conductivity type defining a channel arrangement of said second vertical DMOS structure, and a second well region of said second conductivity type having a greater junction depth than said second channel well region and a shallower junction depth than said first well region.

4. A semiconductor device according to claim 3, wherein said second channel well region has a junction depth substantially equivalent to that of said first channel well region.

5. A semiconductor device according to claim 2, wherein said detection part has a DMOS structure, and wherein said subordinate well region comprises a second channel well region of said second conductivity type defining a channel arrangement of said DMOS structure.

6. A semiconductor device according to claim 2, wherein said detection part has a DMOS structure, and wherein said subordinate well region comprises a second channel well region of the second conductivity type for forming a channel arrangement of said DMOS constitution, and a second well region of the second conductivity type connected to said second channel well region through lateral diffusion only.

7. A semiconductor device according to claim 6, wherein said second well region has a greater junction depth than said second channel well region.

8. A semiconductor device with a current detection function, comprising:
a semiconductor substrate having a heavily doped semiconductor layer and a lightly doped semiconductor layer disposed on said heavily doped semiconductor layer, said lightly doped semiconductor layer being of a first conductivity type;
said lightly doped semiconductor layer having a first portion associated with a principal current part of said semiconductor device and a second portion associated with a current detection part of said semiconductor device, wherein said current detection part detects current in said principal current part and has a lower current capacity than said principal current part;
a principal well region of a second conductivity type disposed at a main surface of said lightly doped semiconductor layer in said first portion;
a subordinate well region of said second conductivity type disposed at said main surface of said lightly doped semiconductor layer in said second portion, wherein a distance from a distal portion of said subordinate well region relative to said main surface of said lightly doped semiconductor layer is less than a distance of a distal portion of said principal well region relative to said main surface of said lightly doped semiconductor layer;

a first surface electrode region of heavily doped first conductivity type disposed in said principal well region; and a second surface electrode region of heavily doped first conductivity type disposed in said subordinate well region.

9. A semiconductor device according to claim 8, wherein:

said principal well region includes a first well region which defines a bottom of said principal well region and a first channel well region overlapping said first well region, said first channel well region being shallower and wider than said first well region.

10. A semiconductor device according to claim 9, wherein:

said subordinate well region includes a second well region which defines a bottom of said subordinate well region and a second channel well region overlapping said second well region, said second channel well region being shallower and wider than said second well region; and said second well region of said subordinate well region having a junction depth shallower than a junction depth of said first well region of said principal well region.

11. A semiconductor device according to claim 10, wherein said second channel well region of said subordinate well region has a junction depth substantially equivalent to that of said first channel well region of said principal well region.

12. A semiconductor device according to claim 10, further comprising:

a first gate electrode for said principal current part, which is disposed such that said first gate electrode defines a first channel at a surface of said principal well region between said lightly doped semiconductor layer in said first portion and said first surface electrode region; and a second gate electrode for said current detection part, which is disposed such that said second gate electrode defines a second channel at a surface of said subordinate well region between said lightly doped semiconductor layer in said second portion and said second surface electrode region.

13. A semiconductor device according to claim 12, wherein said first gate electrode and said second gate electrode are electrically connected with each other.

14. A semiconductor device according to claim 10, wherein:

said principal well region and said subordinate well region are provided with a same electrical potential; and said subordinate well region includes a second channel well region which has a junction depth that is shallower than a junction depth of said first well region of said principal well region.

15. A semiconductor device according to claim 14, wherein said second channel well region of said subordinate well region has a junction depth substantially equivalent to that of said first channel well region of said principal well region.

16. A semiconductor device according to claim 14, further comprising:

a first gate electrode for said principal current part, which is disposed such that said first gate electrode defines a first channel at a surface of said principal well region between said lightly doped semiconductor layer in said first portion and said first surface electrode region; and a second gate electrode for said current detection part, which is disposed such that said second gate electrode defines a second channel at a surface of said subordinate well region between said lightly doped semiconductor layer in said second portion and said second surface electrode region.

17. A semiconductor device according to claim 16, wherein said first gate electrode and said second gate electrode are electrically connected with each other.

18. A semiconductor device according to claim 17, wherein:

said subordinate well region envelopes therein a lateral MOS structure having a third gate electrode; and said first gate electrode, said second gate electrode and said third gate electrode are electrically connected with each other.

19. A semiconductor device according to claim 16, wherein said subordinate well region envelopes therein a lateral MOS structure having a third gate electrode.

20. A semiconductor device according to claim 19, wherein:

said subordinate well region includes a supplemental channel well region which has a junction depth deeper than a said junction depth of said second channel well region and shallower than a junction depth of said first well region of said principal well region; and said supplemental channel well region is disposed to envelop a third channel of said lateral MOS structure.

21. A semiconductor device according to claim 14, wherein:

said subordinate well region includes a supplemental channel well region which has a junction depth deeper than a junction depth of said second channel well region and shallower than a junction depth of said first well region of said principal well region.

* * * * *

UNITED STATES PATENT AND TRADEMARK OFFICE
CERTIFICATE OF CORRECTION

PATENT NO. : 5,654,560
DATED : August 5, 1997
INVENTOR(S) : NISHIZAWA et al.

It is certified that error appears in the above-identified patent and that said Letters Patent is hereby corrected as shown below:

On the title page,

[30] Foreign Application Priority Data

Please change:

"March 29, 1993 [JP] Japan 5-89815"

to

--March 29, 1993 [JP] Japan 5-69815--.

Signed and Sealed this

Third Day of August, 1999

Attest:

Q. TODD DICKINSON

Attesting Officer

Acting Commissioner of Patents and Trademarks